Figure 1:
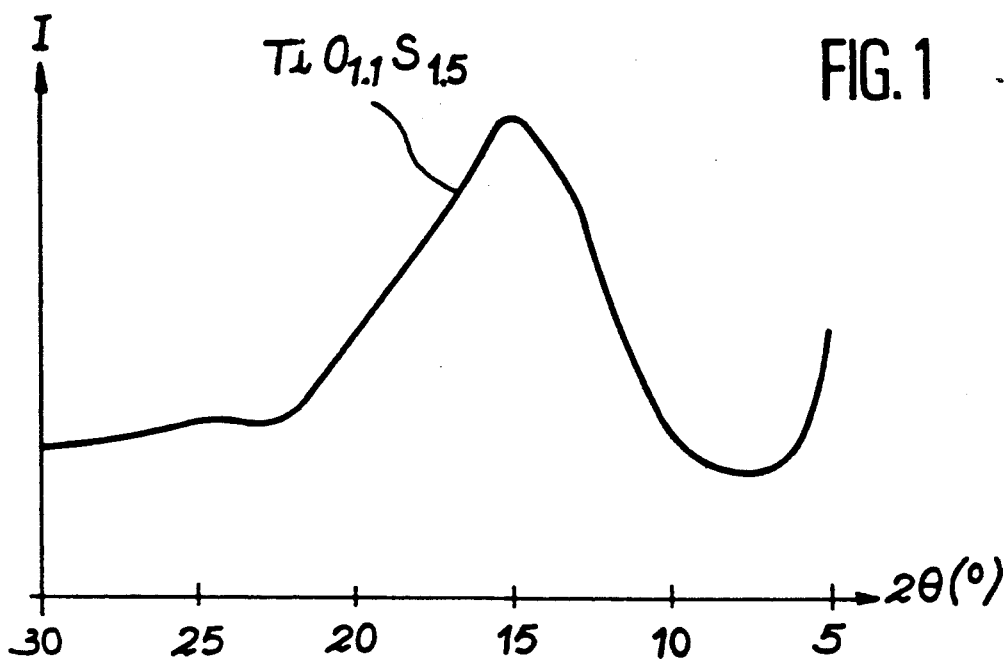

United States Patent [19]

Meunier et al.

[11] Patent Number: 5,202,201
[45] Date of Patent: Apr. 13, 1993

[54] COMPOSITE ELEMENT HAVING A TITANIUM CHALCOGENIDE OR OXYCHALCOGENIDE LAYER, MORE PARTICULARLY USABLE AS THE POSITIVE ELECTRODE IN A THIN FILM ELECTROCHEMICAL CELL

[75] Inventors: Georges Meunier, Labrede; Richard Dormoy; Alain Levasseur, both of Gradignan, all of France

[73] Assignee: Centre National De La Recherche Scientifique, Paris, France

[21] Appl. No.: 675,917

[22] PCT Filed: Nov. 2, 1989

[86] PCT No.: PCT/FR89/00568
§ 371 Date: May 2, 1991
§ 102(e) Date: May 2, 1991

[87] PCT Pub. No.: WO90/05387
PCT Pub. Date: May 17, 1990

[30] Foreign Application Priority Data

Nov. 4, 1988 [FR] France .................. 88 14435

[51] Int. Cl.$^5$ .................. C23C 14/34; H01M 4/58; H01M 6/18
[52] U.S. Cl. .................. 429/193; 204/192.15; 204/192.29; 359/265; 359/273; 428/689; 428/698; 428/701; 429/218
[58] Field of Search .................. 204/192.15, 192.17, 204/192.28, 192.29, 290 F; 429/162, 193, 218; 359/265, 267, 269, 270, 273; 428/689, 698, 701

[56] References Cited

U.S. PATENT DOCUMENTS

| 4,299,892 | 11/1981 | Diner et al. ............... 429/194 |
| 4,324,803 | 4/1982 | Bergmann et al. ............... 428/472 |
| 4,555,456 | 11/1985 | Kanehori et al. ............... 429/131 |
| 4,730,383 | 3/1988 | Balkanski ............... 29/623.5 |
| 4,816,356 | 3/1989 | Balkanski ............... 429/191 |
| 4,889,414 | 12/1989 | Ranh et al. ............... 359/273 |
| 4,945,014 | 7/1990 | Miyabayashi et al. ............... 429/218 |

OTHER PUBLICATIONS

Chemical Abstracts, vol. III, No. 15, Oct. 9, 1989, Abstract No. 11:137484R.
Mater. Sci. Eng., B 1989, B3(1-2), 19-23.

Primary Examiner—John Niebling
Assistant Examiner—William T. Leader
Attorney, Agent, or Firm—Pearne, Gordon, McCoy & Granger

[57] ABSTRACT

The invention relates to a composite element usable in an electrochemical generator. The element comprises a substrate (1) covered by cathodic sputtering with a layer (5) of amorphous material $TiO_aX_B$ with X=S, Se or Te and $$0.01 < a \leq 2,$$

$$0.01 < b \leq 3,$$

$$2 \leq a+b \leq 3.$$

The layer (5) consitutes the positive electrode of the generator and it can be associated with a lithium negative electrode (9) and a lithium ion conductive glass electrolyte (7).

11 Claims, 6 Drawing Sheets

COMPOSITE ELEMENT HAVING A TITANIUM CHALCOGENIDE OR OXYCHALCOGENIDE LAYER, MORE PARTICULARLY USABLE AS THE POSITIVE ELECTRODE IN A THIN FILM ELECTROCHEMICAL CELL

The present invention relates to a composite element having a titanium chalcogenide or oxychalcogenide layer, more particularly usable as the positive electrode in a thin film electrochemical cell, such as an electrochemical generator or an electrochromic cell.

More specifically, it relates to the production of electrochemical cells with solid electrolytes and electrodes and in particular thin film electrochemical cells, whose operating principle is based on the insertion and disinsertion (or intercalation or disintercalation) of an alkali metal ion or a proton in the positive electrode.

Electrochemical cells of this type have numerous applications, e.g. in the form of microgenerators having a total thickness of a few micrometers, in systems for protecting the memories of microsystems during power failures or as integrated systems in smart cards of the bank card type.

These electrochemical cells can also be used as an electrochromic system when the positive electrode changes colour during insertion, which makes them interesting for the display of information or even better, when the negative electrode is transparent, for windows which change colour according to needs (smart windows).

Numerous embodiments of "all-solid" electrochemical cells, optionally of the thin film type and with solid electrodes and electrolyte are known. Thus, French patent FR-A-2 581 483 describes a solid battery or pile successively incorporating an alkali metal coating such as lithium, constituting an ion source, an ionic solid conductive electrolyte coating and a lamellar intercalation composite coating able to receive and accumulate the ions from said alkali metal coating. The lamellar compound can be a substance of formula $MX_2$, e.g. $TiS_2$ and can be deposited by epitaxy.

French patent FR-A-2 550 015 also describes an "all-solid" electrochemical generator constituted by a positive electrode of an insertion compound of lithium, such as crystallized $TiS_2$, an ionic conductive electrolyte by $Li^+$ ions and a negative lithium electrode.

European patent EP-A-0127373 describes a thin film battery having a positive, crystallized $TiS_2$ electrode deposited on a current collector with an amorphous $TiO_2$ intermediate coating, an ionic conductive glass electrolyte and a negative lithium electrode.

Consideration has also been given to the production of generators having solid positive electrodes of amorphous transition metal chalcogenide by chemical processes in the manner described in U.S. Pat. No. 4,299,892 and WO-88/00172.

In the case of positive, crystallized $TiS_2$ electrodes, the insertion and disinsertion of lithium are made more difficult due to the anisotropic character of the electrode. Moreover, these electrodes have a poor resistance to insertions and disinsertions and have an inadequate stability.

In the case of chemically prepared, amorphous, positive electrodes, the electrode preparation procedure is not suitable for the production of thin films.

"All-solid" generators are not entirely satisfactory, because the current densities which can be obtained remain below 20 $\mu A/cm^2$. In addition, the use of a solid electrolyte with amorphous electrodes causes certain problems, because these electrolytes are not very good ionic conductors. Therefore, the performance characteristics of the generator are limited, because the surface state of the electrodes does not make it possible to use a solid electrolyte thickness below 20 $\mu m$ in order to avoid any risk of direct contact between the positive electrode and the negative electrode.

The present invention specifically relates to a composite element usable as the positive electrode and in particular in thin film form, in an "all-solid" electrochemical cell, which makes it possible to obtain better results and obviate the aforementioned disadvantages.

The composite element according to the invention is constituted by a substrate coated by cathodic sputtering with an isotropic, amorphous material coating complying with the formula:

$$TiO_aX_b$$

in which X represents a sulphur, selenium or tellurium atom and a and b are such that $0 < a \leq 2$, $0 < b \leq 3$ and $2 \leq a+b \leq 3$.

Generally X represents a sulphur atom.

In this case, the isotropic material is of the titanium oxysulphide type.

Thus, the composite element according to the invention comprises a preferably conductive substrate and a $TiO_aX_b$ coating, which cannot be separated from one another as a result of the cathodic sputtering preparation process.

According to the invention, due to the choice of a material of type TiO X and its deposition by cathodic sputtering, an isotropic, amorphous material coating is obtained having a much lower density than that of crystallize $TiO_2$ or $TiS_2$, which has a very good resistance as a result to the insertion and disinsertion of alkali metal ions or protons. Thus, this low density corresponds to an expanded amorphous structure and there is no swelling of the material during the insertion of the ions. Thus, there is no deterioration of the coating, because the ions are transported without any morphology change. This isotropic coating also offers the advantage of permitting a good diffusion of the lithium in all directions.

Brief exposure to the air of the $TiO_aX_b$ coating can modify the values of a and b on the surface of the coating without causing any deterioration to the electrochemical properties of the composite element.

Therefore the isotropic material according to the invention is of considerable interest for use as an electrode in an "all-solid" electrochemical cell. Moreover, it would appear that in the said material only the titanium participates in the electrochemical reaction. Thus, in the case where X represents sulphur, it can be assumed that the sulphur is present in the material in two oxidation states, which would make it possible to obtain a reversible system at lower voltage.

Preferably, said isotropic material is an oxysulphide. In this case, a is generally at least equal to 0.01 and this also applies when X represents Te or Se. In the same way, b is generally at least equal to 0.01.

The substrates used in this composite element can be of widely varying natures, i.e. conductive, insulating, flexible or rigid. Generally use is made of an electricity conducting substrate or a mixed substrate having an insulating support covered by an electricity conducting layer on which is deposited the isotropic material coating $TiO_aX_b$.

The electricity conducting layer can in particular be of metal, e.g. Pt, Ni, Al, etc., of monocrystalline silicon or of an electricity conducting oxide such as mixed indium and tin oxides (ITO).

The insulating support can be of a ceramic material, pyrex, a glass or a plastics material resisting the cathodic sputtering conditions, e.g. a flexible plastics material such as a polyester, namely ethylene glycol polyterephthalate or a polyimide.

These flexible substrates in particular make it possible to continuously produce composite elements having a large surface area, because they can be made to travel continuously in the cathodic sputtering deposition enclosure.

The composite element according to the invention can thus constitute the positive electrode of an electrochemical generator with the electrode support and/or the associated current collector. In operation, alkali metal ions or protons are inserted in said positive $TiO_aX_b$ electrode.

Thus, the invention also relates to an electrochemical cell having a positive electrode, a negative electrode able to supply and accept protons or alkali metal ions and an ionic conductive electrolyte positioned between the two electrodes, characterized in that the positive electrode is formed by a composite element having a substrate and an isotropic, amorphous material layer deposited by cathodic sputtering and complying with the formula:

$$TiO_aX_b$$

in which X represents S, Se or Te and a and b are such that $0 < a \leq 2$, $0 < b \leq 3$ and $2 \leq a+b \leq 3$.

As hereinbefore, X preferably represents S and a and b are generally at least equal to 0.01.

In operation, the composition of the $TiO_aX_b$ layer evolves in a reversible manner and corresponds to the formula:

$$M_cTiO_aX_b$$

in which M represents a proton or an alkali metal ion, c is such that $0 \leq c \leq 4$ and X, a and b have the meanings given hereinbefore.

The operation of said electrochemical cell does not correspond solely to the following electrochemical reactions:

$$Ti^{4+} + 1e^- \rightleftarrows Ti^{3+} (E^0 = 0.1V)$$

$$M^+ + 1e^- \rightleftarrows M (E^0 = -3.045V \text{ with } M=Li)$$

$E^0$ represents the standard potential relative to the hydrogen electrode and is defined in the case of solutions.

The overall reaction is in this case:

$$Ti^{4+} + Li \rightleftarrows Ti^{3+} + Li^+$$

and this corresponds to an electromotive force of 2.945 V.

This is theoretical because, as will be shown hereinafter, on the one hand the activity of the ion $M^+$ can differ and on the other other ionic species coming e.g. from sulphur can participate in the electrochemical reaction.

With the positive electrode described hereinbefore, the negative electrode can be in particular produced from lithium or a material containing lithium. The lithium-containing material can be a lithium alloy or a lithium compound. For example, it is possible to use mixed oxides of lithium and transition metal T such as $Li_2TO_3$.

It is also possible to use for the negative electrode a lithium compound of the same nature as the positive electrode, but having a different lithium activity in such a way as to form a concentration cell.

The negative electrode is preferably in the form of a thin film deposited by conventional processes, e.g. vacuum evaporation or cathodic sputtering. The thin films obtained by such processes are very advantageous, because the departure of the ions creates no vacuum at the interface.

The negative electrode can also be produced from an alloy or a compound incorporating other alkali metals, e.g. sodium, potassium, cesium or rubidium, or a compound able to release protons such as metal hydrides, namely $LaNi_5H_6$ and hydroxides such as iridium hydroxide.

When the negative electrode is of lithium, it is possible to use as the solid electrolyte a lithium ion-conductive glass. The latter must be an electronic insulator in order to avoid the autodischarge of the generator, but its ionic conductivity must be as high as possible.

Thus, the electrolyte must fulfil two essential functions, namely that of being an excellent electronic insulator between the two electrodes and that of being a good ionic conductor. Its thickness must be adequate and the coating must be strictly free from defects such as holes or cracks, which would have the immediate consequence of shortcircuiting the generator during the deposition of the negative electrode.

Glasses based on boron oxide, lithium oxide and lithium salt can be used, e.g. glasses containing in various proportions $B_2O_3$, $Li_2O$ and $Li_rX'$ with $X'$ representing an anion able to combine with the lithium in the form of a salt and r representing the valency of the anion $X'$. Examples of usable anions $X'$ are halides and sulphate.

It is also possible to use conductive glasses based on sulphides, e.g. boron sulphide, lithium sulphide and lithium salt glasses.

When the negative electrode comprises other alkali metals or protons, the electrolyte can be constituted by glasses of the same type containing the same alkali metal ions or protons.

The electrolyte can be in the form of a coating produced by vacuum evaporation or cathodic sputtering. Preference is given to the use of cathodic sputtering to obtain a defect free, thin, continuous film. It is also possible to use as the electrolyte solid ionic conductive polymer materials, e.g. of the polyoxyethylene type.

The electrochemical cell according to the invention can be produced by conventional processes by successively depositing on a substrate covered with an electricity conductive coating forming the current collector, a first coating of an isotropic, amorphous $TiO_aX_b$ material, a second solid electrolyte coating and a third coating forming the negative electrode.

According to the invention, the first isotropic material coating constituting the positive electrode is deposited by cathodic sputtering, preferably magnetron cathodic sputtering. This makes it possible to obtain a homogeneous, continuous, compact thin film having an extremely regular profile without surface porosities.

The thickness of the $TiO_aX_b$ coating can vary within a wide range. Preference is generally given to a thin film with a thickness of 200 nm to 10 μm.

This structure is particularly advantageous, because the deposited electrolyte can be in the form of a coating with a smaller thickness than in the case of the prior art "all-solid" electrochemical cells.

Thus, even when using electrolytes having a low ionic conductivity, it is possible to obtain higher current densities than in the prior art electrochemical cells by using smaller electrolyte thicknesses and without risk of short-circuits.

Moreover, by choosing an organic or inorganic, ionic conductive glass with conductivity by alkali metal ions such as lithium, the only mobile element is the lithium, the anions being blocked in the electrolyte structure. Thus, ionic transport takes place by a single element and the thin film system facilitates said transport and makes it possible to obtain improved performance characteristics.

The introduction of oxygen into the isotropic material $TiO_aX_b$ can take place either prior to the deposition of the coating in the target used for cathodic sputtering deposition, or during deposition using a very low partial oxygen or water vapour pressure.

When the oxygen is introduced into the deposition atmosphere, the partial oxygen or water vapour pressures are generally in the range $2.10^{-5}$ to $5.10^{-4}$ hPa.

Although the isotropic $TiO_aX_b$ coatings obtained according to the invention are less conductive than crystallized $TiS_2$ coatings, they still have an adequate conductivity to be used in an electrochemical cell.

For the production of the electrochemical cell, the second solid electrolyte coating and the third coating forming the negative electrode can be deposited by conventional processes appropriate for producing thin films. It is in particular possible to deposit the solid electrolyte by cathodic sputtering or vacuum evaporation and the negative electrode by vacuum evaporation.

The characteristics and advantages of the invention can be gathered from the following non-limitative, exemplified description and with reference to the attached drawings, wherein show:

FIG. 1 The X-diffraction spectrum of a $TiO_{1.1}S_{1.5}$ coating according to the invention.

Figure 2:
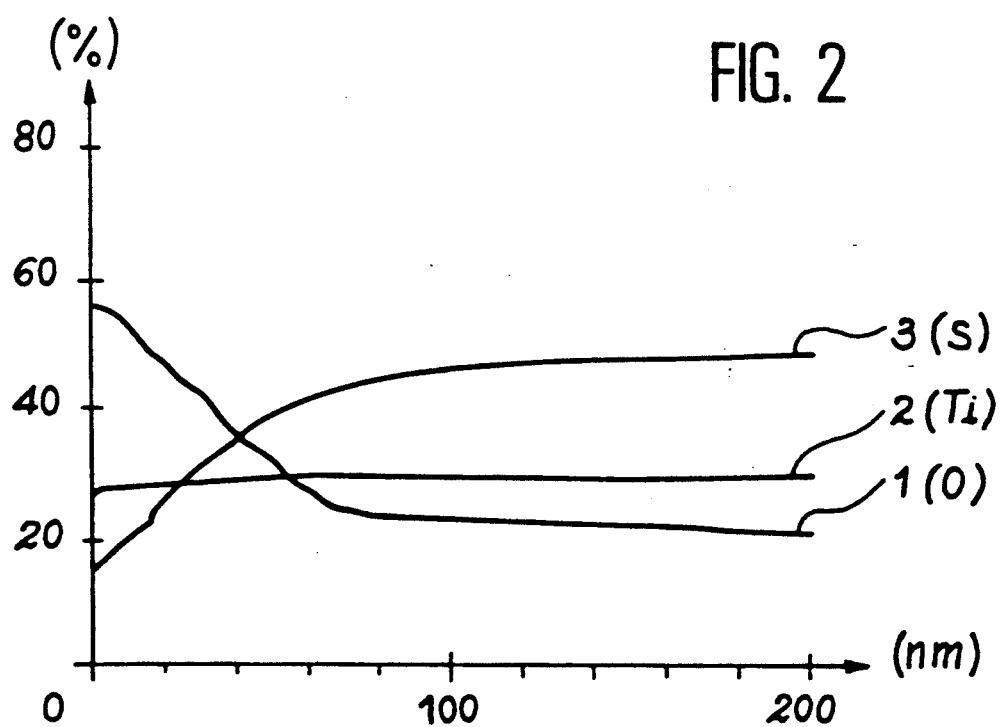

FIG. 2 A concentration profile obtained by Auger spectroscopy during the erosion of the same $TiO_{1.1}S_{1.5}$ coating.

Figure 3:
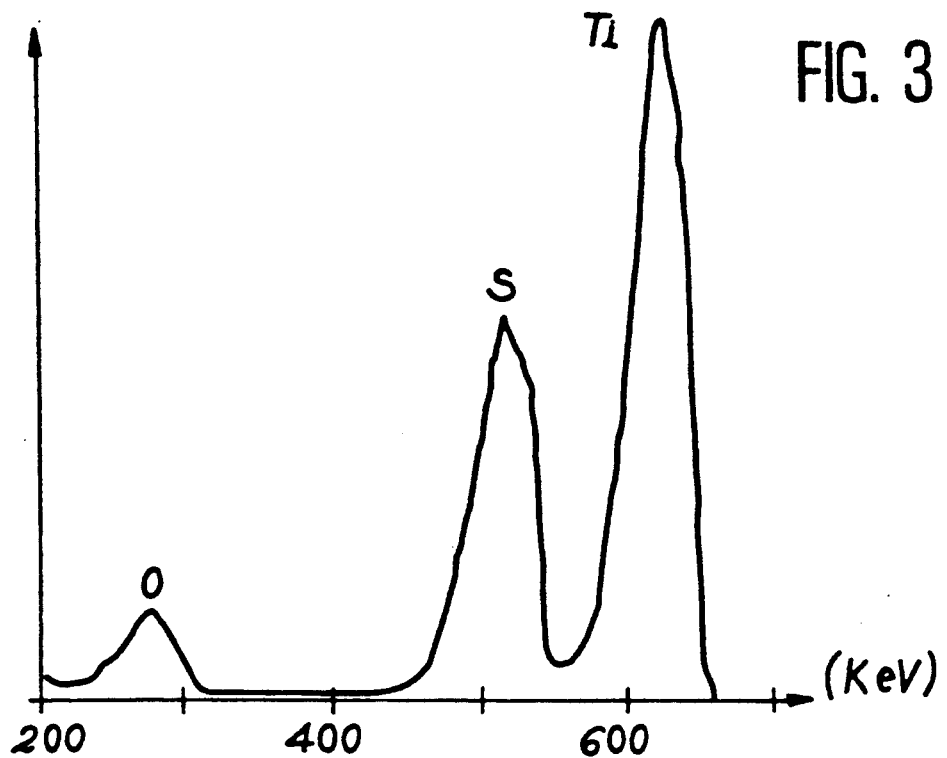

FIG. 3 The results of the analysis of the same coating by alpha particle back scattering.

Figure 4:
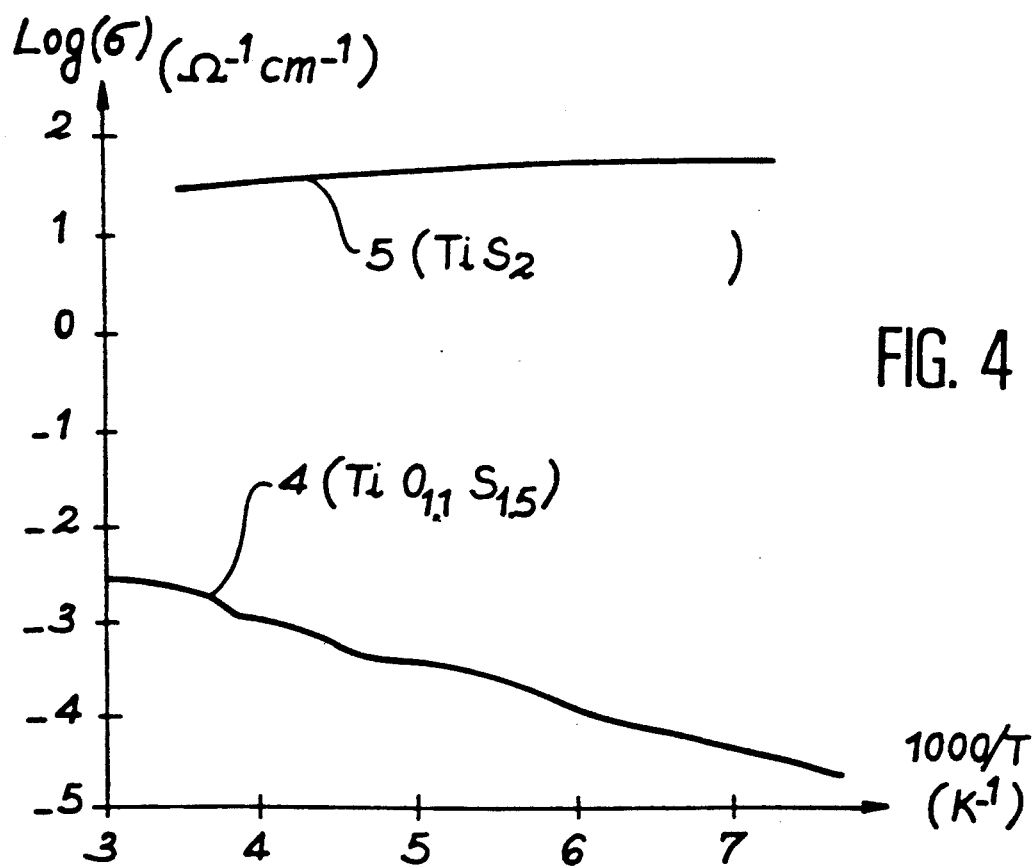

FIG. 4 The evolution of the electronic conductivity as a function of the temperature for crystallized $TiS_2$ and $TiO_{1.1}S_{1.5}$.

Figure 5:
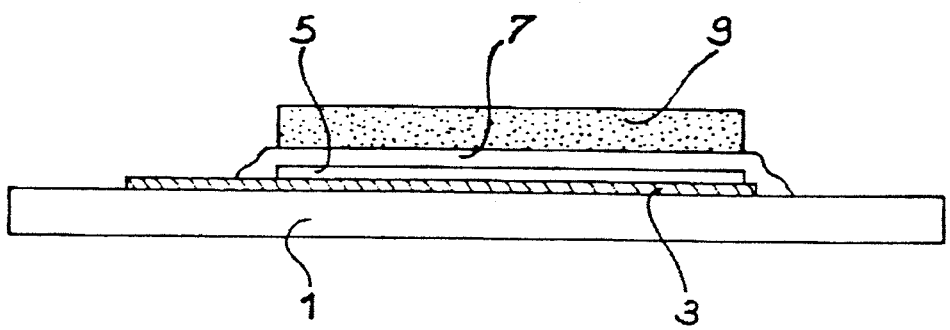

FIG. 5 In cross-section an electrochemical generator according to the invention.

Figure 6:
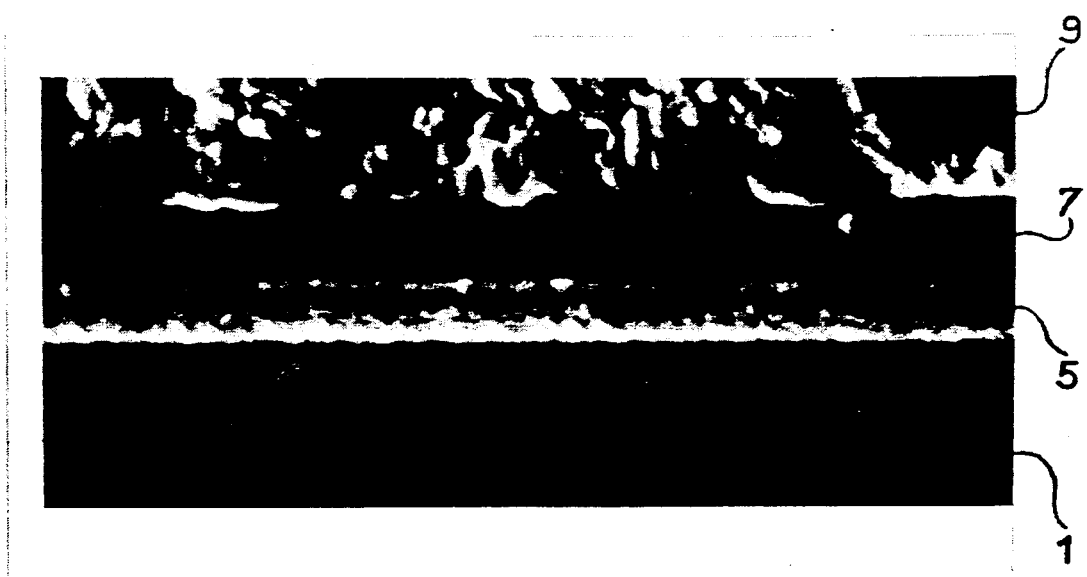

FIG. 6 A scanning microscopy image of the section of the generator of FIG. 5.

Figure 7:
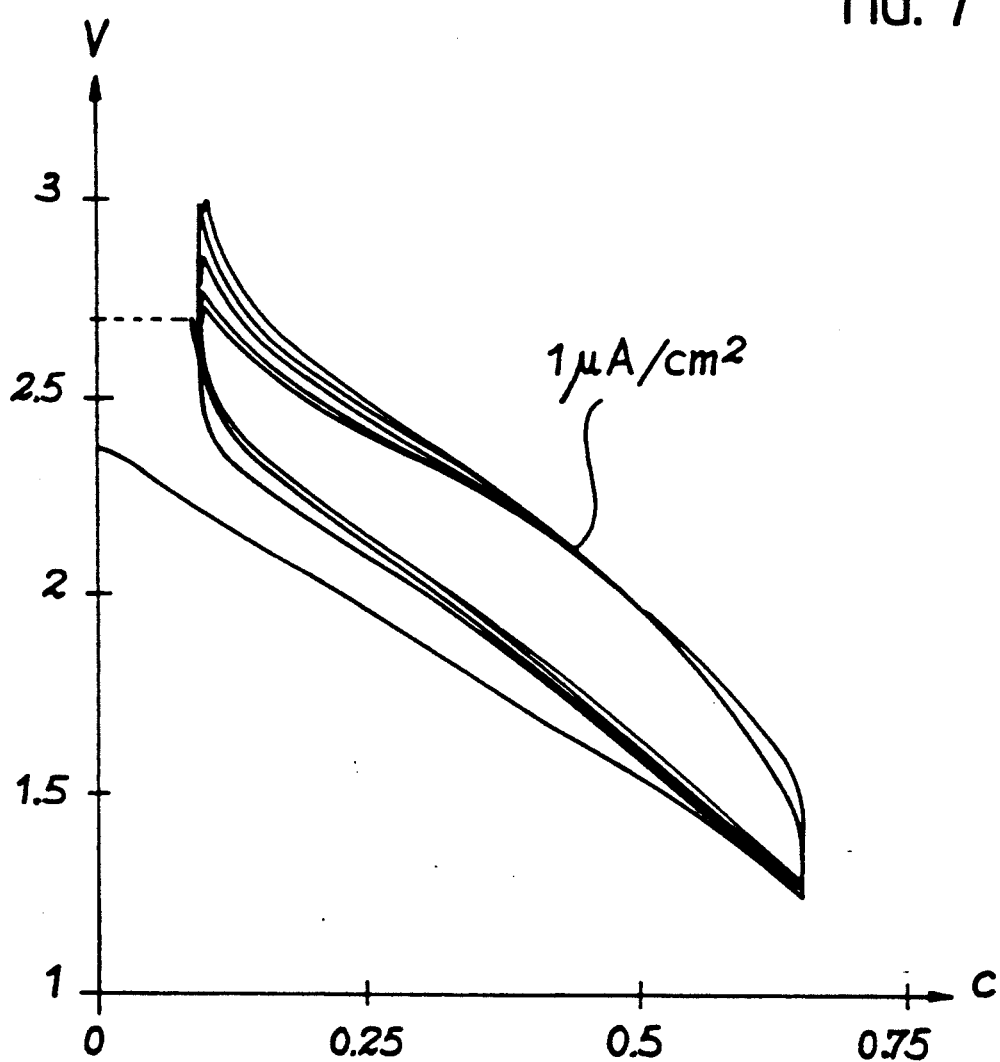

FIG. 7 A cycling curve of the generator as a function of the insertion rate or level of the lithium.

Figure 8:
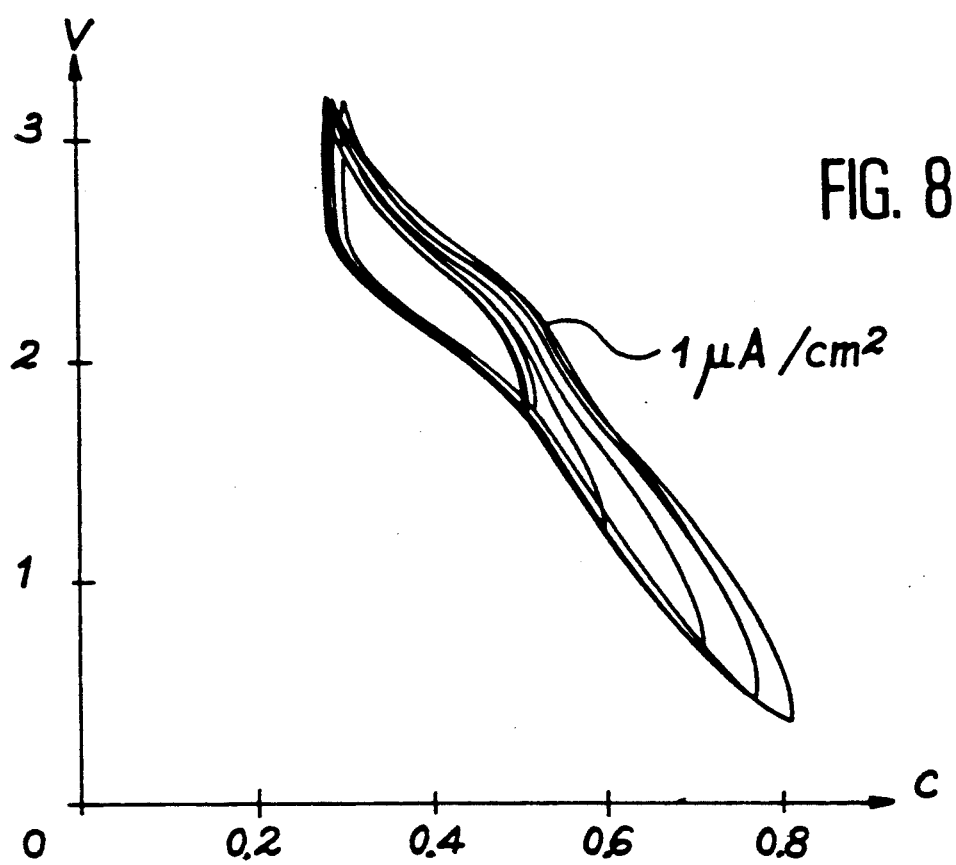

FIG. 8 A cycling curve of the generator as a function of the lithium insertion level or rate, whilst progressively decreasing the discharge potential.

Figure 9:
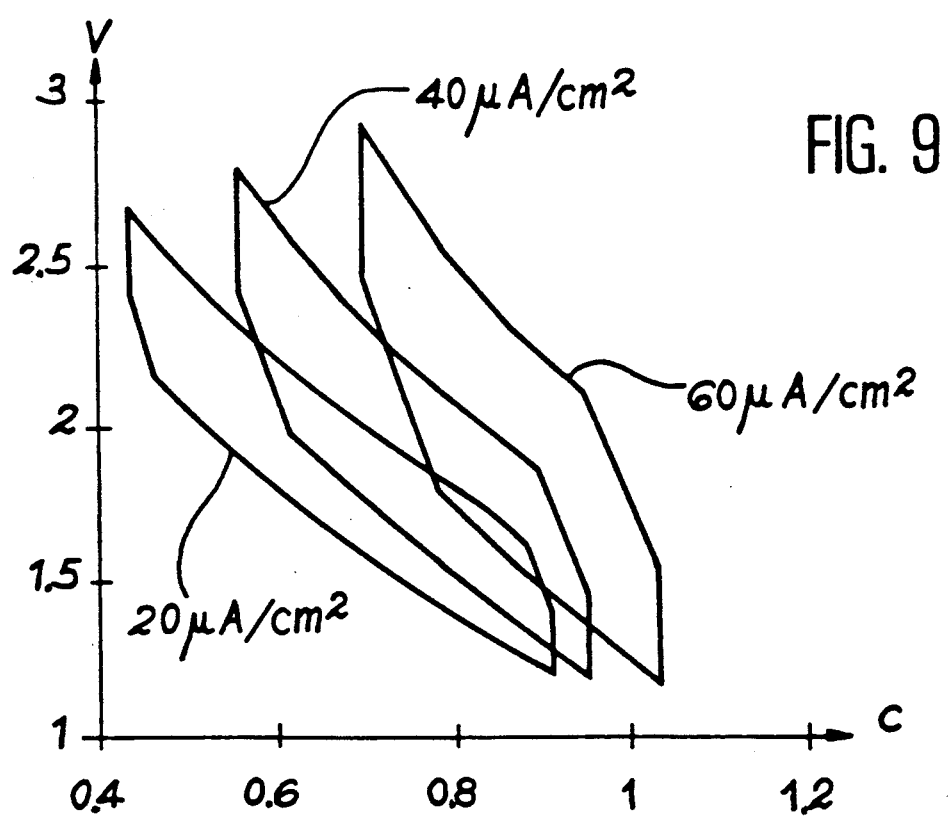

FIG. 9 Cycling curves of the same generator at different current densities.

Figure 10:
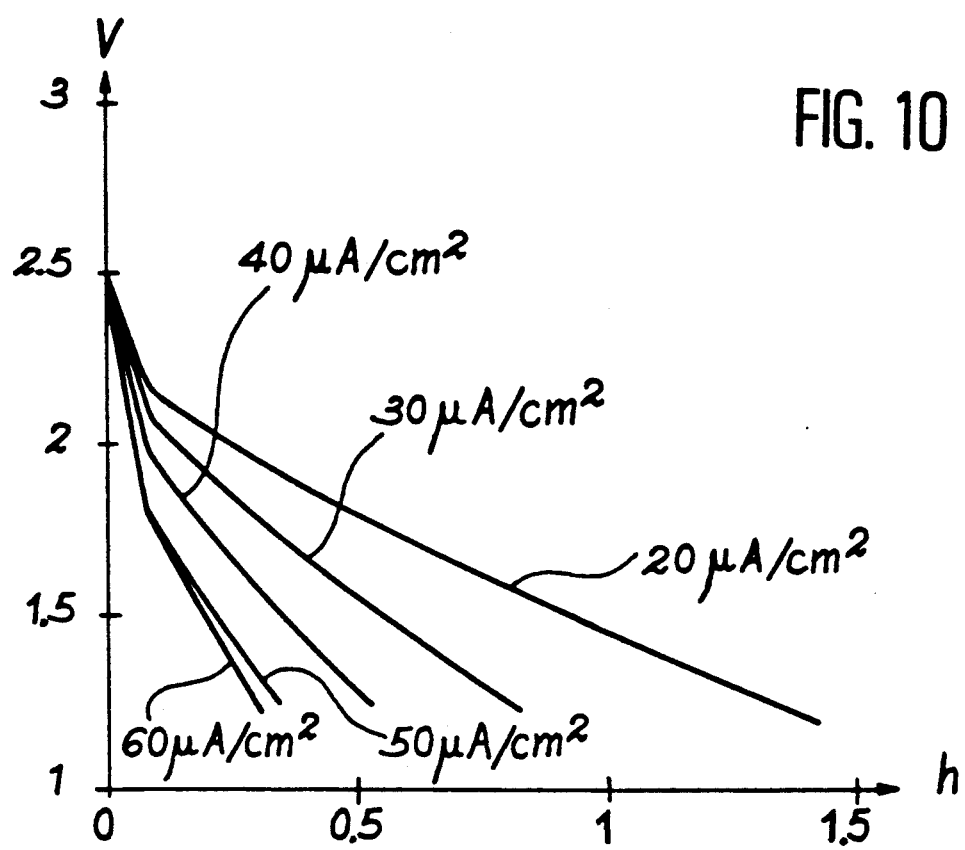

FIG. 10 Variations of the discharge time for different current densities.

Figure 11:
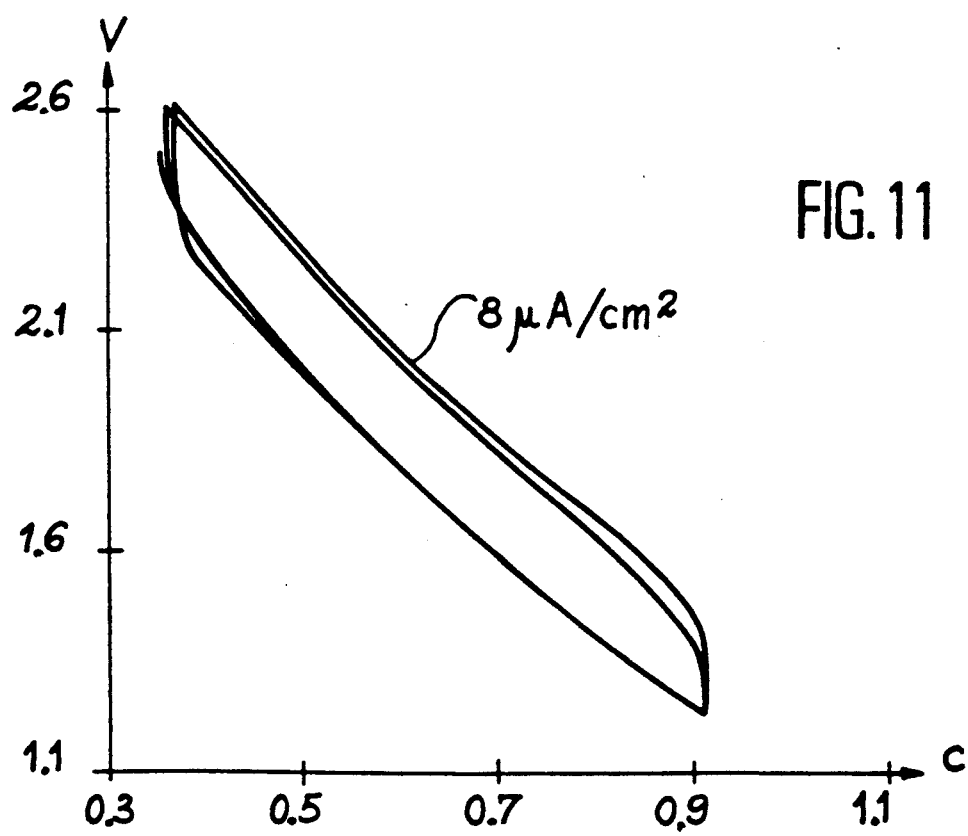

FIG. 11 The cycling curve as a function of the lithium insertion rate c of another generator according to the invention.

EXAMPLE 1

This example illustrates the construction of a current microgenerator having a glass substrate coated by a platinum current collector, a positive titanium oxysulphide electrode, a lithium ion-conductive glass electrolyte and a negative lithium electrode.

The starting product is a substrate constituted by a 7.5×2.5×0.1 cm glass plate on which the different coatings or films are produced in the following way.

a) Platinum Current Collector

The platinum coating or film is deposited by radiofrequency cathodic sputtering using a Leybold Heraeus L 560 apparatus equipped with a terbomolecular pump and a diameter 75 mm magnetron target with the distance between the target and the substrate being 45 mm and with a limit vacuum reached prior to deposition of $2.10^{-7}$ hPa.

The deposition conditions are:
argon pressure: $5.10^{-3}$ hPa
power: 50 W
target voltage: 95 V
duration: 5 min.

This leads to an approximately 0.2 μm thick platinum film.

b) $TiO_aS_b$ Positive Electrode

On said platinum film is deposited by cathodic sputtering a titanium oxysulphide film from a titanium sulphide target containing approximately 5 atomic % oxygen. This target is prepared by pelletizing a $TiS_2$ powder containing 5% oxygen, followed by fritting at 400° C. under argon for 12 h.

In order to produce the film by cathodic sputtering use is made of the same apparatus as in example 1 and deposition takes place under the following conditions:
argon pressure: $10^{-2}$ hPa
power: 50 W, i.e. 1.13 W/cm$^2$
target voltage: 100 V
deposition time: 3 h.

This gives a dark brown titanium oxysulphide film with metallic glints, which is amorphous to X-rays and whose thickness determined by electronic microscopy is 1.1 μm. The amorphous structure of the film is also confirmed by electronic diffraction.

This is followed by the determination of the density of said film by X-ray absorption. A density of approximately 2 is detected, which only represents 64% of the density of crystallized $TiS_2$ (d=3.22) and 50% of that of crystallized $TiO_2$ (d≈4).

Thus, the material obtained has a low density which, combined with the absence of crystallization, is very favourable for the insertion of lithium without creating disturbances within the material. Thus, the film has no porosity, is compact, continuous and homogeneous.

The composition of the material obtained is proved by Auger spectroscopy. The X-diffraction spectrum is shown in FIG. 1 and confirms the amorphous state of the material.

FIG. 2 shows the results obtained by Auger spectrometry during an erosion of the film, i.e. the concentration profiles of the constituent elements as a function of the thickness (in nm) of the film. Curve 1 refers to the oxygen concentration, curve 2 to the titanium concentration and curve 3 to the sulphur concentration.

FIG. 2 reveals a high surface proportion of oxygen in the film, which is probably due to the partial hydrolysis of the film during transfers in the presence of air. There is also a significant oxygen quantity throughout the film thickness.

In order to precisely determine the composition of the film, analysis takes place by the RBS method (Rutherford Back Scattering), i.e. by back scattering alpha particles.

The results obtained are shown in FIG. 3, where there are three peaks corresponding respectively to O, S and Ti. By integration of the peaks, it is possible to deduce the composition of the film, which corresponds to $TiO_{1.1}S_{1.5}$.

Electronic conductivity measurements are also carried out on said $TiO_{1.1}S_{1.5}$ film. The results obtained are given in FIG. 4, which represents the variations of the conductivity $\sigma$ as a function of the temperature. Curve 4 refers to $TiO_{1.1}S_{1.5}$, whereas curve 5 refers to $TiS_2$. Thus, $TiO_{1.1}S_{1.5}$ has very different properties to $TiS_2$.

The conductivity of $TiO_{1.1}S_{1.5}$ is of the semiconductor type and is lower than that of $TiS_2$, which is of the metallic type. This can be due to the composition change, as well as to the absence of crystallization. However, said conductivity still remains satisfactory for a positive electrode material and does not constitute a limiting factor.

c) Deposition of the Electrolytic Coating

The electrolyte used is of glass with the composition $1B_2O_3$-0.8 $Li_2O$-0.8 $Li_2SO_4$. A glass coating of this composition is deposited by cathodic sputtering using the same equipment as hereinbefore and a glass target obtained by pelletizing a glass powder of the same composition, followed by fritting in air at 600° C. for 6 h.

The deposition conditions are as follows:
argon pressure: $10^{-2}$ hPa
power: 100 W, i.e. 2.26 W/cm$^2$
target voltage: 250 V
duration: 4 h.

Thus, an electrolytic coating is obtained whose thickness, measured by scanning electron microscopy, is 1.8 μm. The coating is amorphous to X-rays.

The ionic conductivity of the coating is determined by the method of complex impedances.

The variation of the conductivity as a function of the temperature follows the Arrhenius law, its value being $1.6 \cdot 10^{-7} \Omega^{-1}cm^{-1}$ at 25° C. and the activation energy is 0.6 eV.

Despite the relatively low conductivity, the resistance which can be attributed to the electrolyte in the microgenerator remains low.

d) Deposition of the Negative Electrode

The negative electrode is made from lithium and is deposited by secondary vacuum evaporation by heating metallic lithium by the Joule effect in an iron crucible. The deposition conditions are:
residual vacuum: $10^{-7}$ hPa
water-cooled substrate
crucible-substrate spacing: 10 cm
crucible temperature: 430° C.
evaporation time: 4 min.

This gives a lithium film, whose thickness, measured by scanning electron microscopy, is 15 μm.

As the lithium film reacts with nitrogen and atmospheric humidity, vacuum evaporation is carried out and then the generator is transferred into a glove box containing dry nitrogen with the aid of a tight module. It is then encapsulated with a hydrophobic epoxy resin and is then kept in a tight container.

FIG. 5 shows in vertical section the microgenerator obtained in this way. It can be seen that the microgenerator comprises a substrate (1) covered with a platinum current collector coating (3), a titanium oxysulphide coating (5), an ionic conductive glass electrolytic coating (7) and the lithium coating (9) constituting the negative electrode.

FIG. 6 is a scanning microscopy image illustrating a section of the microgenerator of FIG. 5. On this micrograph, it is possible to see the substrate (1), the titanium oxysulphide coating (5), the electrolytic coating (7) and the negative lithium electrode (9). It can be seen that the titanium oxysulphide coating (5) is continuous, very regular, homogeneous and of very limited thickness. This in particular makes it possible to use a small electrolyte thickness and obtain improve performance characteristics, whilst obviating any short-circuiting risk between the electrodes 5 and 9.

The electrochemical properties of the microgenerator are proved by testing it galvanostatically on an automatic cycling bench controlled by computer. The cycles are performed under the following conditions:
current density: 1 μA/cm$^2$
discharge: minimum threshold voltage 1.25 V
charge: maximum threshold voltage 2.9 V
relaxation: 2 h.

FIG. 7 shows the cycling curve obtained as a function of the lithium insertion rate (c) in the positive $TiO_{1.1}S_{1.5}$ electrode. Cycling was carried out for values of c between 0.1 and 0.7. There is a very good reversibility of the charge-discharge cycles.

Other tests demonstrated that it is possible to carry out more than 500 cycles with a current density of 50 μA/cm$^2$ without there being any performance deterioration on the part of the generator. The first microgenerators were constructed two years ago and no deterioration to their performance characteristics has been observed. Thus, it can be expected that the life of the generators according to the invention will considerably exceed two years.

Other cycling tests are carried out whilst progressively decreasing the bottom discharge potential threshold and working at a current density of 1 μA/cm$^2$. The results obtained are given in FIG. 8.

The latter shows that this microgenerator can withstand a discharge up to 0.4 and can then be recharged without suffering damage.

Thus, contrary to what is obtained with a crystallized $TiS_2$, positive electrode microgenerator, the system is reversible at low voltage. It would therefore appear that titanium is not the only element participating in the electrochemical reaction. Other tests are carried out by progressively increasing the current density and the microgenerator can easily deliver more than 60 μA/cm$^2$, which is much higher than with the prior art generators.

Cycling operations are also carried out with the microgenerator using current densities of 20, 40 and 60 μA/cm$^2$. The cycles take place between a top threshold and a bottom threshold, which are imposed. The results obtained are given in FIG. 9 as a function of the lithium insertion rate c. It can be seen that the electrochemical system reversibility is very good. The polarization is increased under charging conditions when the current density increases, very probably due to the diffusion of the lithium within the material.

The microgenerator obtained has a high capacitance of approximately 50 µAh/cm² for a current of 1 µA/cm² and a low threshold of 0.4 V.

FIG. 10 shows the variation of the discharge time (in h) for variant current densities used.

Thus, the microgenerator according to the invention has very interesting electrochemical properties and in particular a high capacitance, the possibility of delivering a current density above 60 µA/cm², which is considerable compared with the current densities obtainable with the prior art generators, and the property of withstanding without damage repeated cycling operations even at low voltage.

EXAMPLE 2

This example illustrates the production of an electrochemical cell usable as an electrochromic system.

In this case, use is made of a mixed indium and tin oxide current collector incorporating 90% $In_2O_3$ and 10% $SnO_2$ and a coating of this mixed oxide is deposited by cathodic sputtering from a target of the same mixed oxide under the following conditions:
argon pressure: $10^{-2}$ hPa
power: 100 W
target voltage: 300 V
duration: 5 min.

This gives a mixed oxide coating, which is a very good electronic conductor and which has the advantage of being very adhesive and transparent.

The titanium oxysulphide electrode, the electrolyte and the negative lithium electrode are then produced in the same way as in example 1.

The cycling curve of the thus obtained microgenerator operating with a current density of 8 µA/cm² is given in FIG. 11.

The use of a current collector makes it possible for the cell to operate as an electrochromic system. In this case, it is still preferable for the positive electrode to have a composition close to that of titanium oxide (b close to 0.1). Thus, said oxysulphide is transparent in the pure state, but when the lithium is inserted in the positive titanium oxide electrode, the latter assumes a dark blue colour permitting display.

In this case, if it is wished to use the cell as a glass plate which changes colour, it is also necessary to associate a transparent negative electrode, e.g. of iridium hydroxide with a proton conductor and to use larger electrode surfaces.

Thus, the fact of using according to the invention a $TiO_aX_b$ thin film deposited by cathodic sputtering makes it possible to obtain an "all-solid" microgenerator having improved performance characteristics, more particularly due to its isotropic amorphous character and to the low density of the film, which are favourable to the insertion of the lithium, and to the presence of another species (O or S) participating in the electrochemical reaction.

The simultaneous use of a thin film electrolyte also deposited by cathodic sputtering also helps to obtain good electrochemical characteristics, particularly due to its good ionic conductivity, its excellent electronic insulation and its good adhesion, which prevents autodischarging of the generator.

Although in these examples a description has been given of microgenerators with a small electrode surface, it is obvious that the invention also applies to generators having a large electrode surface and with a non-negligible power.

For the production of such generators, consideration can be given to the use of a flexible insulating substrate, which is made to travel in the deposition enclosure or enclosures in order to successively coat it with the different coatings.

For use purposes, if desired, it can be in the form of a reel, provided that between the layers of the reel there is an insulating film constituted either by the substrate, or by an additional film.

We claim:

1. Composite element constituted by a substrate coated by cathodic sputtering of a homogeneous, continuous, compact, thin layer of an isotropic, X-ray amorphous material in accordance with the formula:

$$TiO_aX_b$$

in which X represents a sulphur, selenium or tellurium atom and a and b are such that $0.01 \leq a \leq 2$, $0.01 \leq b \leq 2$ and $2 \leq a+b \leq 3$, said coating having a thickness of 200 nm to 10 µm, an amorphous structure and a density lower than that of crystallized $TiO_2$ or $TiS_2$, without surface porosity.

2. Element according to claim 1, characterized in that X represents a sulphur atom.

3. Composite element according to any one of the claims 1 and 2, characterized in that the substrate is an insulating material covered by an electricity conducting material layer on which is deposited the $TiO_aX_b$ material coating.

4. Electrochemical cell having a positive electrode, a negative electrode able to release an alkali metal ion or proton and an ionic conductive electrolyte positioned between the two electrodes, characterized in that the positive electrode is formed by a homogenous, continuous, composite, thin coating of isotropic, X-ray-amorphous material, deposited by cathodic sputtering and in accordance with the formula:

$$TiO_aX_b$$

in which X represents S, Se or Te, and a and b are such that $0.01 \leq a \leq 2$, $0.01 \leq b \leq 2$ and $2 \leq a+b \leq 3$, said coating having a thickness of 200 nm to 10 µm, an amorphous structure and a density lower than that of crystallized $TiO_2$ or $TiS_2$, without surface porosity.

5. Electrochemical cell according to claim 4, characterized in that X represents S.

6. Electrochemical cell according to any one of the claims 4 and 5, characterized in that the negative electrode is of lithium.

7. Electrochemical cell according to claim 6, characterized in that the electrolyte is a lithium ion conductive glass.

8. Electrochemical cell according to claim 7, characterized in that the ionic conductive glass contains in variable proportions $B_2O_3$, $Li_2O$, $Li_rX'$ with $X'$ representing an anion of valency r.

9. Electrochemical cell according to any one of the claims 4 and 5, characterized in that the positive electrode is deposited on a substrate having a conductive layer forming a current collector.

10. Electrochemical cell according to claim 9, characterized in that the current collector is of platinum.

11. Electrochemical cell according to claim 9, characterized in that the current collector is of transparent conductive glass.

* * * * *